United States Patent
Hedler et al.

(10) Patent No.: US 7,342,320 B2
(45) Date of Patent: Mar. 11, 2008

(54) ELECTRONIC COMPONENT WITH SEMICONDUCTOR CHIPS, ELECTRONIC ASSEMBLY COMPOSED OF STACKED SEMICONDUCTOR CHIPS, AND METHODS FOR PRODUCING AN ELECTRONIC COMPONENT AND AN ELECTRONIC ASSEMBLY

(75) Inventors: Harry Hedler, Germering (DE); Ingo Wennemuth, München (DE)

(73) Assignee: Infineon Technologies AG, Munich (DE)

( * ) Notice: Subject to any disclaimer, the term of this patent is extended or adjusted under 35 U.S.C. 154(b) by 378 days.

(21) Appl. No.: 10/132,826

(22) Filed: Apr. 25, 2002

(65) Prior Publication Data

US 2002/0158345 A1   Oct. 31, 2002

(30) Foreign Application Priority Data

Apr. 25, 2001  (DE) ............................... 101 20 408

(51) Int. Cl.
*H01L 23/48* (2006.01)

(52) U.S. Cl. .................. 257/786; 257/686; 257/777; 257/723; 257/620; 257/737; 257/619

(58) Field of Classification Search ................ 257/621, 257/620, 686, 738, 778, 780, 783, 786, 792, 257/773, 774, 777, 723, 737, 619; 438/108, 438/109, 113, 118, 124, 126, 127, 612, 666, 438/629, 637, 639, 640, 667, 668, 672, 675, 438/700, 701, 713

See application file for complete search history.

(56) References Cited

U.S. PATENT DOCUMENTS

| | | | |
|---|---|---|---|
| 4,249,299 A | | 2/1981 | Stephens et al. |
| 5,736,456 A | * | 4/1998 | Akram .................. 438/614 |
| 5,770,884 A | * | 6/1998 | Pogge et al. ............... 257/506 |
| 5,870,289 A | * | 2/1999 | Tokuda et al. ............. 257/778 |
| 5,962,917 A | * | 10/1999 | Moriyama ................. 257/697 |
| 5,977,640 A | * | 11/1999 | Bertin et al. .............. 257/777 |
| 5,986,338 A | * | 11/1999 | Nakajima ................. 257/700 |
| 5,990,545 A | * | 11/1999 | Schueller et al. .......... 257/697 |
| 6,097,091 A | * | 8/2000 | Ohsumi ................... 257/758 |
| 6,107,109 A | * | 8/2000 | Akram et al. .............. 438/15 |
| 6,111,317 A | * | 8/2000 | Okada et al. .............. 257/737 |
| 6,249,053 B1 | * | 6/2001 | Nakata et al. ............. 257/738 |
| 6,291,259 B1 | * | 9/2001 | Chun ..................... 438/106 |
| 6,407,458 B1 | * | 6/2002 | Huemoeller .............. 257/778 |
| 6,577,013 B1 | * | 6/2003 | Glenn et al. .............. 257/777 |

(Continued)

FOREIGN PATENT DOCUMENTS

DE   198 40 248 A1   3/2000

(Continued)

*Primary Examiner*—Junghwa Im
(74) *Attorney, Agent, or Firm*—Laurence A. Greenberg; Werner H. Stemer; Ralph E. Locher (57) ABSTRACT

An electronic component includes a semiconductor chip with an active front face and a passive rear face, with contact connections and contact surfaces respectively being provided on the active front face and/or on the passive rear face, and with conductive connections being provided in the form of structured conductive tracks for providing an electrical connection from the active front face to the passive rear face. An electronic assembly formed of stacked semiconductor chips, and a method for producing the electronic component and the electronic assembly are also provided.

12 Claims, 4 Drawing Sheets

U.S. PATENT DOCUMENTS

6,777,767 B2 * 8/2004 Badehi ........................ 257/432
2001/0018236 A1 * 8/2001 Badehi ........................ 438/127

FOREIGN PATENT DOCUMENTS

| GB | 2 345 383 A | 7/2000 | |
| JP | 57-10251 | * 1/1982 | ................ 21/92 |
| WO | WO 99/08318 | 2/1999 | |

* cited by examiner

ELECTRONIC COMPONENT WITH SEMICONDUCTOR CHIPS, ELECTRONIC ASSEMBLY COMPOSED OF STACKED SEMICONDUCTOR CHIPS, AND METHODS FOR PRODUCING AN ELECTRONIC COMPONENT AND AN ELECTRONIC ASSEMBLY

BACKGROUND OF THE INVENTION

Field of the Invention

The invention relates to an electronic component with semiconductor chips, to an electronic assembly composed of stacked semiconductor chips, to a method for producing an electronic component with semiconductor chips, and to a method for producing an electronic assembly composed of stacked semiconductor chips.

In order to stack electronic components more densely, or to integrate them on a larger scale, especially integrated semiconductor components, also called semiconductor chips, they can be stacked in a number of layers. In this case, both individual semiconductor chips or else larger units of semiconductor chips, i.e. semiconductor wafers, can be stacked before they are separated. In order to connect the semiconductor chips or wafers, which are provided one on top of the other, to one another electrically and mechanically at their contacts, the chips or wafers are soldered. For this purpose, apertures are produced in the wafer through the use of a KOH etching process. The inner surfaces of these apertures are then metalized. In this way, a number of wafers can be mechanically and electrically connected, and thus stacked one on top of the other, via a solder point. In the case of such an anisotropic etching process, flank angles of approximately 54° are, however, produced in order to produce the apertures in the semiconductor material, which results in the etched holes having a relatively large extent on the rear faces of the etched semiconductor chips. When a large number of contacts are being produced, they may in some cases be located very close to one another. This results in a risk of mechanical weakening of the wafer.

Furthermore, when contacts are located very close to one another, there is a risk of a bridging contact being produced between adjacent contact points during soldering. The thinner the wafer, the smaller are these risks, and this can be achieved by grinding material away in order to reduce the wafer thickness. The distance between the centers of adjacent contact points may be approximately 130 µm. Thus, with the flank angle of 54° mentioned above, the wafer would have to be ground to a thickness of less than 100 µm, which results in difficulties for production reasons and in the risk of considerably increasing the wastage rates.

In order to produce stacked three-dimensional topographies of semiconductor chips, which are referred to as chip size packages (CSP), the wafers are split along the separating joints between the individual semiconductor chips using an etching process in order, subsequently, to produce conductive connections from the respective active faces of the semiconductor chips between their rear faces and the contact connections or contact surfaces located on them and which are to be soldered.

SUMMARY OF THE INVENTION

It is accordingly an object of the invention to provide an electronic component with a semiconductor chip, an electronic assembly composed of stacked semiconductor chips, as well as a method for producing them which overcome the above-mentioned disadvantages of the heretofore-known devices and methods of this general type and which produce reliable conductive connections and contacts in a simple and cost-effective manner between the individual semiconductor chips.

With the foregoing and other objects in view there is provided, in accordance with the invention, an electronic component, including:
a semiconductor chip having an active front face and a passive rear face;
contact elements selected from the group consisting of contact connections and contact surfaces, the contact elements being disposed on at least one of the active front face and the passive rear face; and
structured conductive tracks for providing an electrical connection between the active front face and the passive rear face.

According to the invention, the electronic component has a semiconductor chip with an active front face and a passive rear face, with contact connections being provided on the active front face, and/or contact surfaces being provided on the passive rear face. Conductive connections in the form of structured conductive tracks are provided for electrical connection (redistribution wiring) of the active front face and of the passive rear face of the semiconductor chip.

In the electronic component according to the invention, structured conductive tracks are provided directly on the side surfaces of the electronic component, which advantageously makes them highly mechanically robust and ensures reliable electrical contact between contact connections on the front face and/or contact surfaces on the rear face and the electronic circuits on the semiconductor chip. An electronic component according to the invention such as this is highly suitable for stacking, and thus for forming relatively complex electronic assemblies.

In one embodiment of the invention, at least one side surface of the electronic component has conductive tracks applied to its surface. This embodiment has the advantage that it results in a very compact and robust structure, which means that there is no need for conductive connections in the form of fine wires or the like. Furthermore, conductive tracks such as these can easily be formed with different widths or thicknesses as required, in order to take account of the different current flow levels.

A further embodiment provides for the conductive tracks to in each case follow the edge profile of the semiconductor chip at the transitions from the side surfaces to the passive rear face and/or to the active front face, which has the advantage that the conductive tracks, which are applied directly to the substrate material, have an optimally short conductor length, and thus a minimal conductor resistance.

The invention provides for the conductive tracks of the electronic component to be composed of aluminum, copper, silver or gold, or else from a multilayer coating composed of a number of these metals. Depending on the characteristics desired of the conductive tracks, it is possible to use the materials that are optimum for this purpose for the conductive tracks. Conductive tracks composed of aluminum can be produced cost-effectively and have, for example, the advantage that they are easy to metalize. Conductive tracks composed of copper, silver or gold have a minimal conductor resistance, with silver and gold furthermore having the advantage of only a minimal tendency to oxidation.

A further embodiment of the invention provides for the side surfaces of the semiconductor chips to be etched, which has the advantage that the surface produced in this way is ideally planar, and is highly suitable for subsequent metalization. In this context, this embodiment has the advantage that, if the side surfaces of the semiconductor chip are etched, there is no need for any further machining through the use of grinding, material removal or the like in order to prepare the electronic component for metalization.

A further embodiment of the invention provides for the transition from the passive rear face of a semiconductor chip to a side surface to run through an edge angle of approximately 117°. This typical edge angle of 117°, which is produced with a trench angle of approximately 54° during anisotropic etching, has the advantage that the maximum etching gap can be defined and controlled very well, thus making it possible to accurately define the etch stop layer of, for example, silicon dioxide ($SiO_2$) which remains in the base of the etched trench after the etching process.

A further embodiment of the invention provides for the semiconductor chips to be produced from a separated semiconductor wafer. This embodiment has the advantage that the semiconductor chips can be manufactured economically at wafer level, and can then be separated into complete semiconductor chips. This allows a very high processing speed to be achieved.

A further embodiment provides, in the case of the electronic component according to the invention, for the semiconductor chips to be produced from a semiconductor wafer which is separated through the use of anisotropic etching. The anisotropic etching method may in this case either be a chemical wet etching method or else a dry etching method—for example through the use of plasma etching, reactive ion etching or ion beam etching. The anisotropic etching method has the advantage that there is no migration underneath photoresist structures. In fact, anisotropic etching makes it possible to produce precisely defined edge angles on the trenches to be etched, which is particularly advantageous in order to produce an exact etching depth for the electronic component according to the invention.

With the objects of the invention in view there is also provided, an electronic assembly, comprising:

stacked electronic components including respective semiconductor chips each having an active front face, a passive rear face, a side face, contact elements selected from the group consisting of contact connections and contact surfaces, the contact elements being disposed on at least one of the active front face and the passive rear face, and each of the semiconductor chips having a respective conductive connection plane extending, via the side face, from the active front face to the passive rear face; and each of the electronic components being connected to another one of the electric components via the contact elements and the conductive connection plane.

According to the invention, an electronic assembly is composed of stacked electronic components with semiconductor chips according to at least one of the embodiments described above, which are connected to one another via conductive connection planes and contact connections. In this case, the invention provides for the conductive connection planes to lead from the respective active front face of the semiconductor chips, over their side surfaces, to their rear face.

This electronic assembly according to the invention has the advantage that a robust and compact three-dimensional structure composed of stacked semiconductor chips can be produced in a relatively simple manner, in which case widely different structures can be produced through the use of different types of stacking.

One embodiment of the electronic assembly according to the invention provides for the electronic components, which form the electronic assembly, with semiconductor chips to be soldered to one another in each case at their contact connections or surfaces, which has the advantage that permanent mechanical and reliable electrical connections can be produced in a simple manner. Soldering allows any desired three-dimensional structures of stacked electronic components with semiconductor chips to be produced, which are permanently connected to one another in this way.

A further embodiment of the electronic assembly according to the invention provides for the electronic components, which form the electronic assembly, with semiconductor chips to be in each case soldered and/or adhesively bonded to one another at their contact connections or surfaces. Combined soldering and/or adhesive bonding of contact connections and surfaces of the electronic components has the advantage that this makes it possible to use automatic techniques to produce a reliable and fast electrical and mechanical connection.

With the objects of the invention in view there is also provided, a method for producing an electronic component with a semiconductor chip having an active front face, a passive rear face, contact connections on the active front face and contact surfaces on the passive rear face, and a conductive connection plane with structured conductive tracks on an etched edge of the semiconductor chip for providing an electrical connection from the active front face to the passive rear face, the method includes the steps of:

providing a semiconductor wafer with semiconductor chips is disposed in rows and columns and with saw track regions provided between the semiconductor chips;

applying an insulation layer for protecting and for insulating the active front face of the semiconductor chips;

applying an etching mask on the passive rear face of the semiconductor chips such that the saw track regions are not covered by the etching mask;

anisotropically etching the saw track regions, which have not been covered by the etching mask, from the passive rear face until reaching an $SiO_2$ layer on the active front face, with the $SiO_2$ layer acting as an etch stop;

removing the $SiO_2$ layer from the front face and singling the semiconductor wafer for separating the semiconductor chips from one another;

removing the etching mask;

passivating the rear face and side edges of the semiconductor chips;

coating the side edges of the semiconductor chips with at least one of an adhesion promoter and a surface coating which can be soldered;

metalizing the side edges;

structuring the insulation layer for exposing the contact connections on the active front face of the semiconductor chips; and applying the conductive tracks for providing a wiring on the insulation layer such that the conductive tracks connect the contact surfaces on the Passive rear face to corresponding ones of the contact connections on the active front face.

A method for producing an electronic component with a semiconductor chip, which has an active front face and a passive rear face, with contact connections respectively being provided on the active front face and/or on the passive rear face, and with conductive connections being provided in the form of structured conductive tracks for electrical connection from the active front face to the passive rear face, and with the conductive tracks on the conductive connection planes being provided on etched edges of the semiconductor chip, has the following method steps according to the invention.

A semiconductor wafer is provided, with semiconductor chips provided in rows and columns and with saw track regions provided between them. An insulation layer is applied to the semiconductor wafer, for protection and for insulation of the active front face of the semiconductor chips. An etching mask is then applied on the passive rear face of the semiconductor chip, with the saw track regions remaining free of resist. Etching is carried out through the use of anisotropic etching of the saw track regions, which have been left free from the etching mask, from the passive rear face until an $SiO_2$ layer is reached on the active front face, with the $SiO_2$ layer acting as an etch stop. The $SiO_2$ layer can then be removed from the front face, and the semiconductor wafer can be separated to form semiconductor chips.

After removal of the etching mask, the rear face and the side edges of the semiconductor chips are passivated, and the side edges of the semiconductor chips are coated with an adhesion promoter and/or with a surface coating which can be soldered.

In the next step, the side edges of the semiconductor chip are metalized, after which the insulation layer is structured. In the process, contact surfaces are exposed on the active front face of the semiconductor chip, and conductive tracks are applied for providing a conductive connection on the insulating layer, with the conductive tracks for conductive connection connecting individual contact connecting surfaces on the passive rear face to contacts on the active front face.

This method according to the invention has the advantage that it allows very compact and large scale integrated electronic assemblies to be produced from semiconductor components using an automated process. Furthermore, these assemblies can be produced in a highly economical manner.

One embodiment of the method according to the invention provides for the saw track regions between the semiconductor chips on the wafer to be provided with round apertures through the $SiO_2$ layer, the inside of which apertures is then metalized, before the wafer is sawn apart along the saw tracks into the semiconductor chips. This method has the advantage that contact can be produced very reliably and easily from the active front faces to connecting contacts on the passive rear faces of the semiconductor chips.

One embodiment of the method according to the invention provides for the apertures each to be connected to conductive tracks on the conductive connection planes and to be a part of the conductive tracks after separation of the semiconductor chips, which has the advantage of reliable contact while the electronic component can at the same time be produced very easily and economically.

With the objects of the invention in view there is also provided, a method for producing an electronic assembly having semiconductor chips stacked on top of one another and connected via conductive connection planes and one of contact connections and contact surfaces, the conductive connection planes being provided on etched edges of the semiconductor chips, the method includes the steps of:

providing a semiconductor wafer with the semiconductor chips disposed in rows and columns and with saw track regions provided between the semiconductor chips;

applying an insulation layer for protecting and for insulating an active front face of the semiconductor chips;

applying an etching mask on a passive rear face of the semiconductor chips such that the saw track regions are not covered by the etching mask;

anisotropically etching the saw track regions, which have not been covered by the etching mask, from the passive rear face until reaching an $SiO_2$ layer on the active front face, with the $SiO_2$ layer acting as an etch stop;

removing the $SiO_2$ layer from the front face and singling the semiconductor wafer for separating the semiconductor chips from one another;

removing the etching mask;

passivating the passive rear face and side edges of the semiconductor chips;

coating the side edges of the semiconductor chips with at least one of an adhesion promoter and a surface coating which can be soldered;

metalizing the side edges;

structuring the insulation layer for exposing the contact connections on the active front face of the semiconductor chips;

applying conductive tracks for providing a wiring on the insulation layer such that the conductive tracks connect one of the contact connections and the contact surfaces to round apertures formed in the saw track regions; and stacking at least two of the semiconductor chips for forming an electronic component.

One method for producing an electronic assembly according to one of the embodiments described above provides for at least the following method steps. After the provision of a semiconductor wafer, with semiconductor chips provided in rows and columns and with saw track regions provided between them, an insulation layer is applied on the active upper face of the semiconductor chips for protection and for insulation of the active upper face. After the application of an etching mask on the passive rear face of the semiconductor chips, with the saw track regions remaining free, an anisotropic etching process is carried out on the saw track regions which have been left free of the etching mask, from the passive rear face until an $SiO_2$ layer is reached on the active front face, with the $SiO_2$ layer acting as an etch stop.

After removal of the $SiO_2$ layer from the front face and the separation of the semiconductor wafer to form semiconductor chips, the etching mask is removed. The rear face and the side edges of the semiconductor chips are then passivated, and the side edges of the semiconductor chips are coated with an adhesion promoter and/or with a surface coating which can be soldered, after which the side edges are then metalized. The insulation layer is structured, leaving free contact surfaces on the active upper face of the semiconductor chip and applying conductive tracks for the conductive connections on the insulating layer, with the conductive tracks for the conductive connections connecting individual contact connecting surfaces to the through-contacts. Finally, at least two semiconductor chips are stacked to form an electronic component.

This method according to the invention has the advantage that it offers the capability to produce large scale integration with mechanically solid conductive connection. There is no need to reserve an area for apertures for conductive connections from the front face to the rear face in this case. Since all the processes can be carried out in parallel on the wafer, this results in a rapid and hence cost-effective production method.

One exemplary embodiment of the method according to the invention provides for the conductive tracks for conductive connections to be applied to the structured insulation layer through the use of screen printing. This method has the advantage that the structuring can be carried out very exactly, while processing can at the same time be carried out relatively quickly.

One exemplary embodiment of the method according to the invention provides for a semiconductor wafer which has lowermost semiconductor chips of a stack as the semiconductor chips to have solder deposits instead of contact connections, which has the advantage that this allows the electronic assembly to be configured in a flexible manner, while being compatible with large scale integration.

A further exemplary embodiment of the method according to the invention provides for a number of semiconductor wafers first of all to be stacked one on top of the other and, once the contact connections have been connected to the conductive tracks of semiconductor wafers located above or below them, for the stacked semiconductor wafers to be separated to form stacked semiconductor chips. This method has the advantage that, before being separated, the wafer can be handled considerably more easily than individual semiconductor chips. Furthermore, this method has the advantage that the processing can be carried out very quickly and economically.

A further exemplary embodiment of the invention, finally, provides for the semiconductor wafers which are stacked one on top of the other to be heated to a soldering temperature for connection of the contact connections to conductive tracks of semiconductor wafers which are located above or below them, which has the advantage of very rapid and reliable connection, and hence a processing capability which can be carried out very quickly and economically.

In summary, this results in the following aspects of the invention. Normally, in the case of a semiconductor wafer with a large number of semiconductor chips processed on it, minimum separations are provided between the chips, in order that the wafer can be sawn apart after manufacture of the semiconductor chips, without the components being damaged in the process. This saw track, which is typically approximately 70 to 120 μm wide, is normally used for functional tests during chip production, but can no longer be used after completion of the chips. The present invention thus provides for the conductive connections which are required to make contact with stacked semiconductor chips (referred to as chip size packages—CSP) to lead to the saw track, and through this to the passive chip rear face.

For this purpose, the finished-processed active front face of a semiconductor wafer is placed on a substrate or on a sawing film with a frame to provide robustness. The passive rear face of the wafer is then provided with an etching mask, which makes it possible to etch the saw track. This etching process starts from the passive rear face and continues in the direction of the active face, with an etched trench being produced, with a broad opening on the rear face. This etched trench has a typical flank angle of 54.7°, as a result of the material. The etching process is carried out anisotropically and may be either chemical wet etching, or else a dry etching process.

An $SiO_2$ layer on the front face of the semiconductor wafer acts as an etch stop layer. This $SiO_2$ layer is removed after the etching process. One variant of the method according to the invention provides for the polyimide layer on the active front face to be provided with apertures, which are then metalized. After removal of the etching mask, the rear face and the etched trench are passivated after which, in a further photolithographic process, an adhesion layer and metalization are applied. Furthermore, the contact surfaces, which are referred to as contact pads, on the rear face of the wafer are prepared. After this step, the separated chips can be removed from the substrate and can be stacked one on top of the other, and both soldering and adhesive bonding techniques can be used for connection of the contacts.

This makes it possible to achieve a very high memory density. Furthermore, there is no need to provide regions of the semiconductor chip for additional apertures for the conductive connections. The entire process chain can be carried out in parallel for each wafer, which allows parallel processing of a large number of individual semiconductor chips. There is no limit to the number of stacked wafers in this case. The individual chips can be tested for malfunctions either on the wafer or on the individual chip. One particularly advantageous feature is that, in general, there is no need to grind each wafer to be thinner, thus resulting in considerable handling advantages and hence cost advantages. There is no need for any specific pretreatment of the commercially available wafers that are used.

Other features which are considered as characteristic for the invention are set forth in the appended claims.

Although the invention is illustrated and described herein as embodied in an electronic component with semiconductor chips, and an electronic assembly composed of stacked semiconductor chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
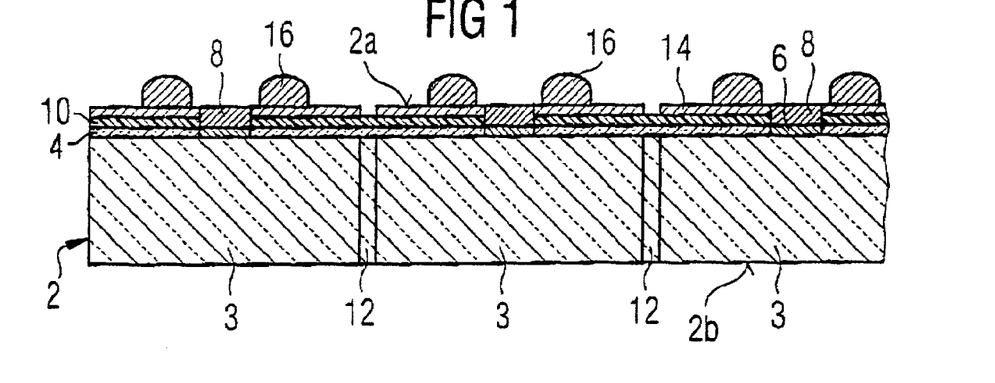
FIG. 1 is a diagrammatic sectional view of a detail of a semiconductor wafer according to the invention.

Referring now to the figures of the drawings in detail and first, particularly, to FIG. 1 thereof, there is shown a schematic cross section through a detail of a semiconductor wafer 2, whose active front face 2a points upward, and whose passive rear face 2b points downward, in the illustrated view. The wafer 2, which has already been provided with complete semiconductor structures, is partially covered on its active front face 2a by an $SiO_2$ layer 4, which is interrupted in places by metalization in the form of aluminum contacts 6. The aluminum contact 6 is covered by a further layer of a nickel-gold contact 8 for electrical connection of the contact 6 to external contact connections. This layer 8 at the same time represents an interruption, in places, in a polyimide layer 10 which is located on the $SiO_2$ layer 4. Two vertical separating joints 12 can be seen in the semiconductor wafer 2, which extends essentially in the horizontal direction, in the illustration that is shown, and, before the wafer 2 has been separated, these represent the component boundaries of the semiconductor chips 3 which are to be separated later. These separating joints 12 are etched in a subsequent process step, in order to separate the semiconductor chips. Contact connections 16 in the form of hemispherical contact studs are located on conductive tracks 14, which are connected to the nickel-gold contacts 8 and are located on the polyimide layer 10. These contact studs are provided in order to be connected electrically and mechanically to corresponding contact surfaces on an adjacent semiconductor chip in a subsequent method step, with the connections being produced either by soldering or by adhesive bonding of the contents.

Figure 2:
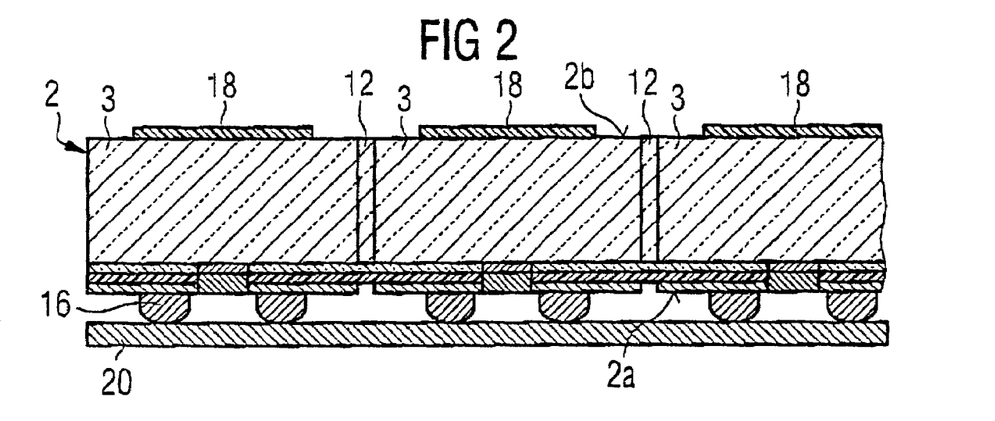
FIG. 2 is a diagrammatic sectional view of the wafer shown in FIG. 1, mounted on a substrate.

FIG. 2 shows a schematic cross section through the semiconductor wafer 2, mounted on a substrate, as shown in FIG. 1, the passive rear face 2b pointing upward in this illustration. The wafer 2 is in this case mounted with its contact connections 16 on a flat wafer substrate 20 in a further process step, in order to make it easier to handle it for the further method steps. Prior to this, the entire active front face 2a of the wafer 2 was provided with a protective insulation layer, in order to prevent mechanical damage to the already structured, and hence sensitive, front face. The passive rear face 2b has already been covered, in this process step, with an etching mask 18, in the form of a photosensitive resist coating, using a lithography method, and this resist coating has gaps in the illustration that is shown, these gaps being produced during development of the exposed photoresist layers. The etching mask 18 is not in each case directly adjacent to the separating joints 12, but allows somewhat broader gaps, which leave free a section with a certain extent symmetrically along the separating joints 12.

Figure 3:
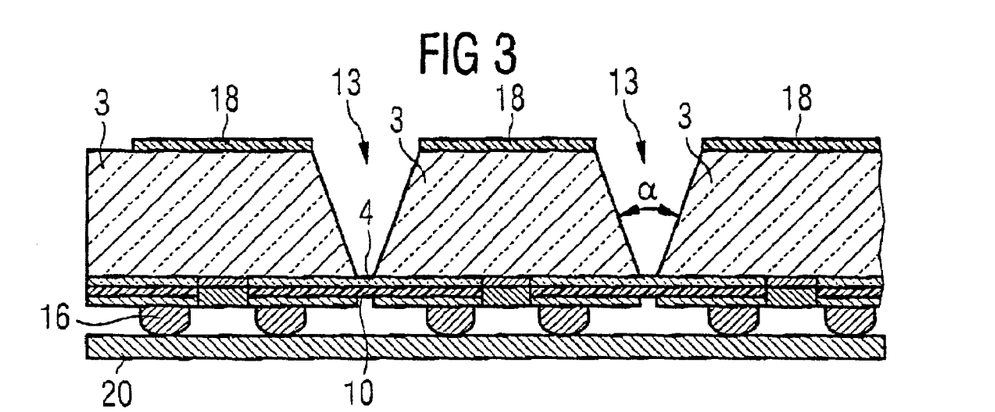
FIG. 3 is a diagrammatic sectional view of a wafer after an etching process on the rear face according to the invention.

FIG. 3 shows a further schematic cross section of a following process step, in which the wafer 2 is separated into its individual components after an etching process has been carried out on its rear face. Those sections above the separating joints 12 which are not covered by the etching mask 18 are in this case etched through as far as the $SiO_2$ layer 4 in an anisotropic etching process, in which there is no etching underneath the sections that are covered by the resist, and with the separating joints 12 in each case being replaced by an etched trench 13. Each etched trench 13 separates one semiconductor chip 3, which is to be separated later, from its adjacent further semiconductor chips 3. The etched trench 13 has a flank angle $\alpha$ of approximately 54.7° owing to the material that is used, and in each case ends at the $SiO_2$ layer 4. This and the polyimide layer 10 located above it still connect the individual semiconductor chips 3 to one another, and must be removed for separation.

Figure 4:
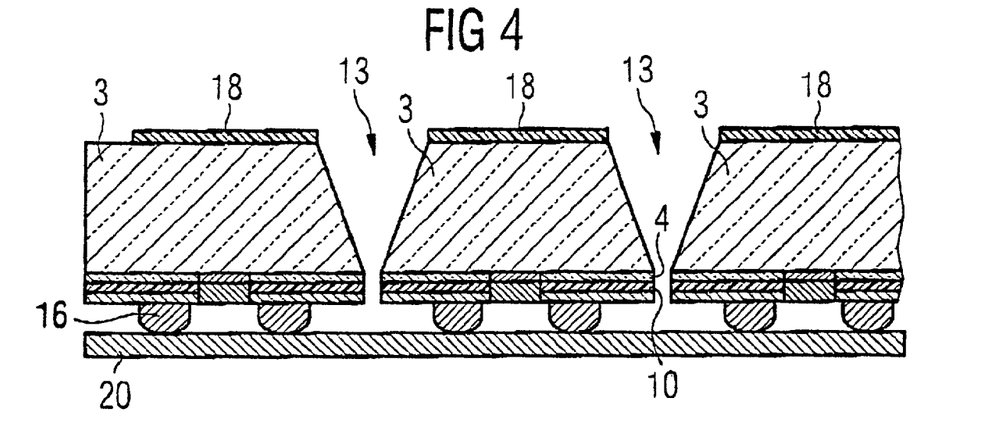
FIG. 4 is a diagrammatic sectional view of the separated wafer according to the invention.

In a process step following this, FIG. 4 shows a schematic cross section through the wafer, which has been separated into semiconductor chips 3. In this case, the $SiO_2$ layer 4 and the polyimide layer 10 at the base of the etched trench 13 are in each case removed, so that the semiconductor chips 3 are separated. This removal of the $SiO_2$ layer 4 and of the polyimide layer 10 is expediently carried out chemically, resulting in smooth edges on the side surfaces of the semiconductor chips 3, which can easily be metalized in a subsequent method step.

Figure 5:
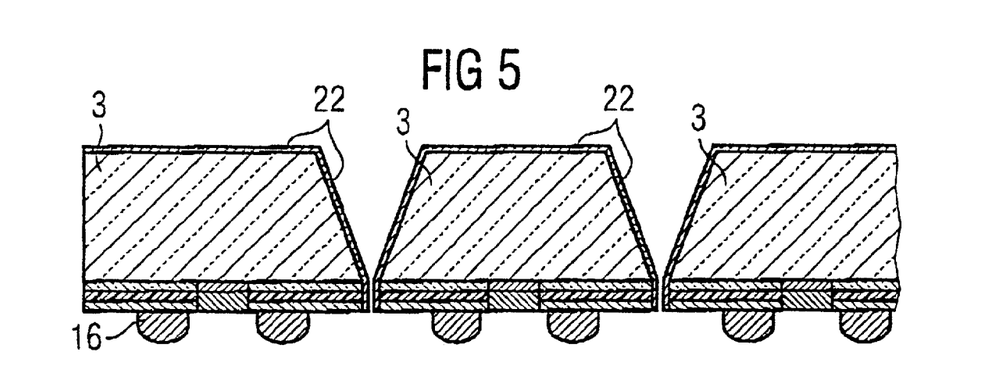
FIG. 5 is a diagrammatic sectional view of a separated wafer for illustrating a further process step on the separated wafer in accordance with the invention.

FIG. 5 shows a schematic cross section through a further process step for the wafer which has been separated into semiconductor chips 3. Once the resist layers of the etching mask 18 have been removed from the rear faces 2b of the semiconductor chips 3, the rear faces and the side surfaces are passivated along the former etched trenches, preferably through the use of thermal oxidation of the silicon to form $SiO_2$, thus resulting in the production of a passivation layer 22.

Figure 6:
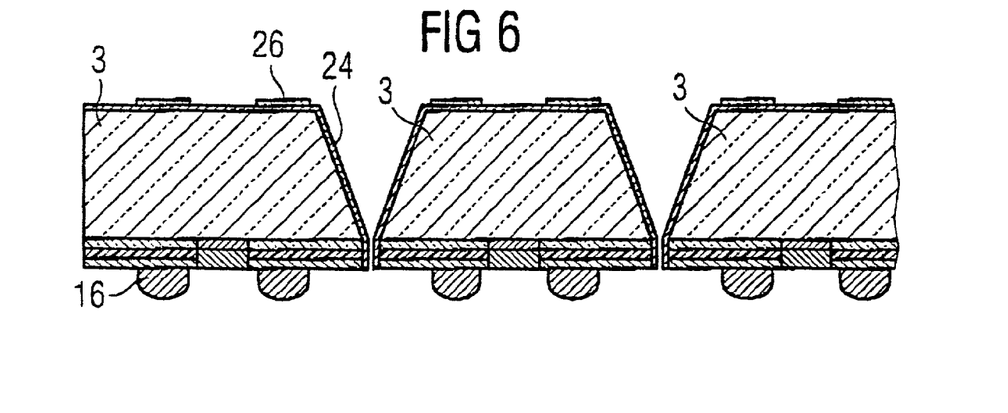
FIG. 6 is a diagrammatic sectional view of the semiconductor chips according to the invention, metalized on the rear face.

FIG. 6 shows a schematic cross section through the semiconductor chips 3, after they have been metalized on their rear faces. In a further method step, these are provided through the use of a further photolithographic method with a metal layer 24 in the form of conductive tracks on the side surfaces and on the rear faces 2b, and with contact surfaces 26 which are connected to the conductive tracks. These contact surfaces 26 are intended to be electrically and mechanically connected to contact connections 16, which correspond to them, on a further semiconductor chip 3, stacked on top, which may be done by soldering or adhesive bonding.

Figure 7:
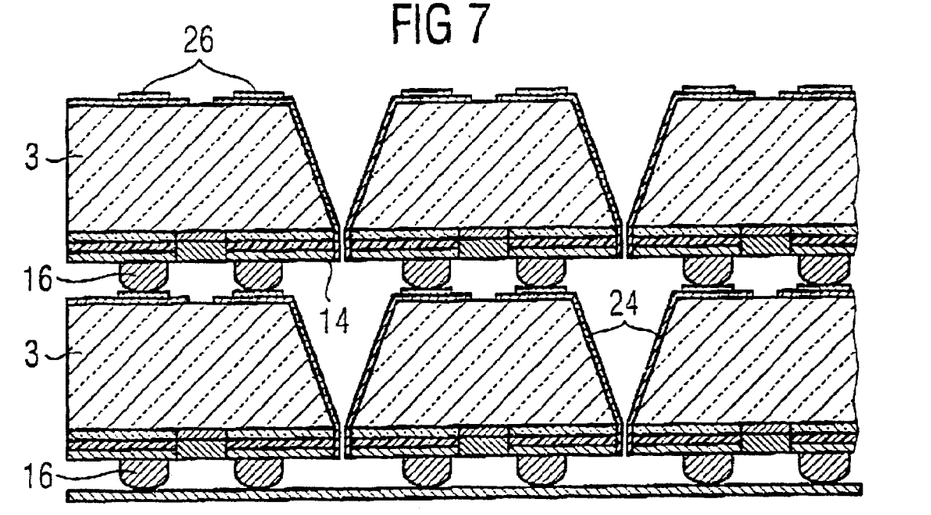
FIG. 7 is a diagrammatic sectional view of an assembly of stacked semiconductor chips according to the invention.

The result of this further process step is illustrated in the schematic cross-sectional view shown in FIG. 7, which shows an assembly formed by stacked semiconductor chips 3. As can be seen, there are a number of semiconductor chips 3 stacked alongside one another and one on top of the other, in each of which contact connections 16, which point downward, of a semiconductor chip 3 are soldered or adhesively bonded to contact surfaces 26, which point upward, on a further semiconductor chip located underneath, so that a mechanical and electrical connection is produced at each of these points.

Figure 8A:
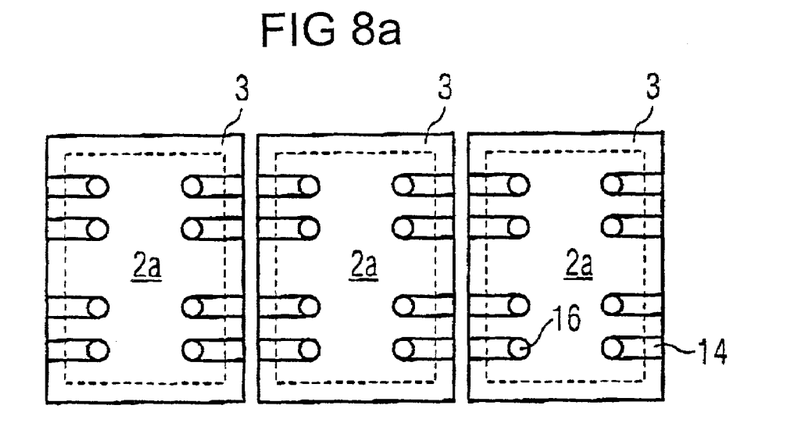
FIGS. 8a and 8b are diagrammatic plan views of an upper face and of a lower face of an assembly as shown in FIG. 7.
Figure 8B:
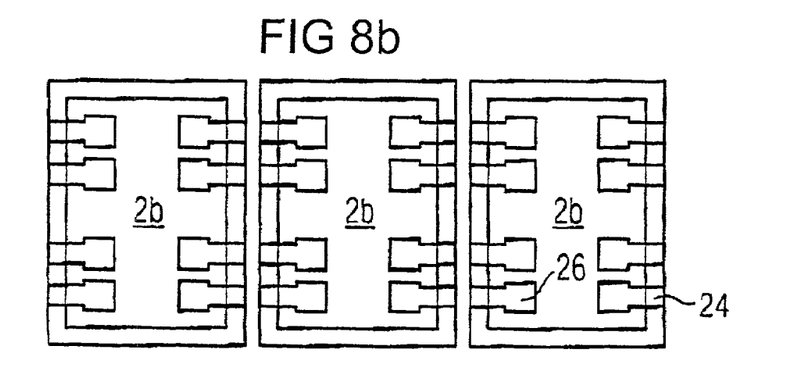

FIGS. 8a and 8b show schematic plan views of an upper face and of a lower face of an assembly as shown in FIG. 7. In this case, FIG. 8a shows the active front faces 2a of three semiconductor chips 3 which are provided alongside one another and are each provided on their front face 2a with a number of contact connections 16 and with conductive tracks 14 connected to them. The conductive tracks 14 and the metal layers 24, which act as conductive tracks, continue, as can be seen in the lower half of the illustration in FIG. 7, as far as the edge of the front face 2a, then follow the edge to the side surface, and continue to the passive rear face 2b of the semiconductor chip 3, where they end at contact surfaces 26.

Figure 9:
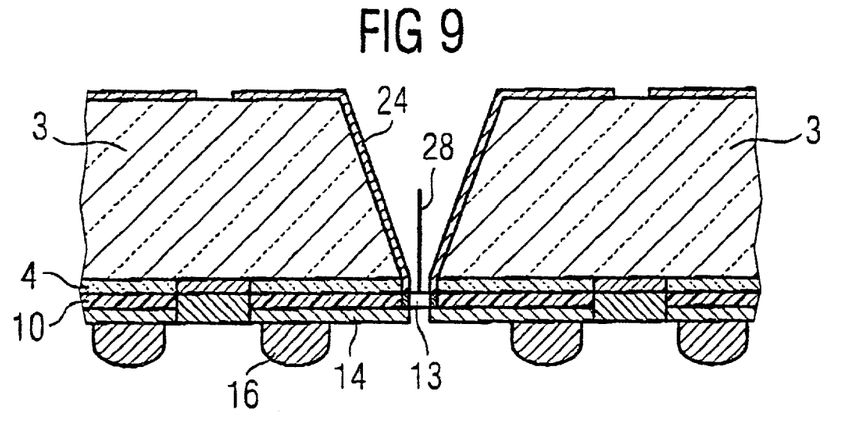
FIG. 9 is a diagrammatic, partial sectional view of a variant of a metalized wafer according to the invention.

FIG. 9 shows a schematic cross section of one variant of a metalized wafer. In this case, the polyimide layer 10 is not removed between the semiconductor chips 3 to be separated in the wafer 2, but is provided with essentially round apertures 30, referred to as vias, which can be metalized on their inner faces, in this way producing a conductive connection between the conductive tracks 14, which are located on the active front face 2a, and the metal layers 24, which are located on the side surfaces of the etched trench 13. Once the apertures have been metalized, the wafers 2 are sawn apart in the base of the etched trench 13, and thus centrally through the apertures 30, as is shown in FIG. 9 by a saw blade 28 provided vertically, as shown.

Figure 10A:
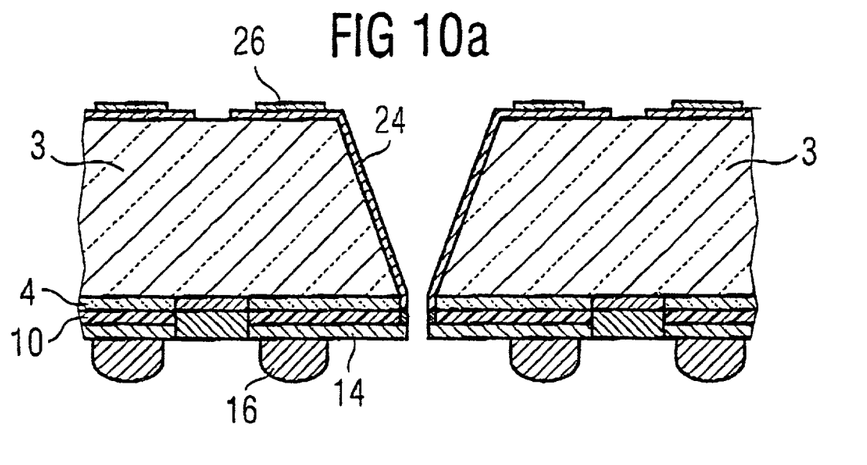
FIG. 10a is a diagrammatic, partial sectional view of a separated wafer as shown in FIG. 9.

FIG. 10a shows a schematic cross section through a separated wafer as shown in FIG. 9. In this view, the illustration does not differ from the illustration shown in FIG. 6. The differences from the embodiment corresponding to FIGS. 1 to 8 can be seen relatively clearly only in the plan view in FIG. 10*b*.

Figure 10B:
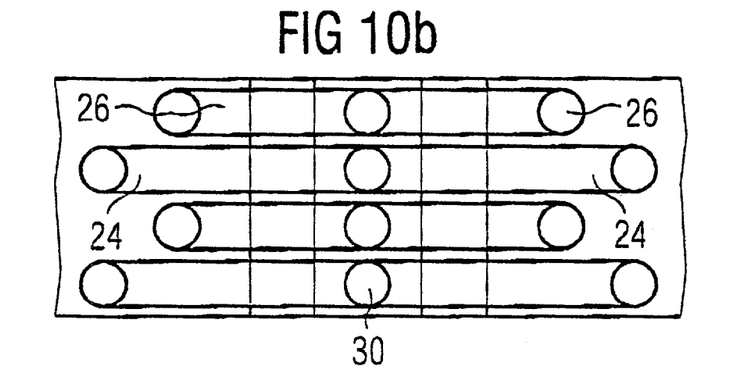
FIG. 10b is a plan view of the passive rear face of two adjacent semiconductor chips according to the invention.

FIG. 10*b* shows a plan view of the passive rear face of two adjacent semiconductor chips 3, with the illustration in this case showing a number of contact surfaces 26 with conductive tracks 24 adjacent to them, which each lead to apertures 30 which are provided in the polyimide layer. The saw blade 30 is passed centrally through the apertures 30 in order to separate the semiconductor wafer 2, thus resulting in individual semiconductor chips 3 being formed. The apertures 30 are metalized on their inner surfaces, and thus produce a connection from the conductive tracks 14, which are connected to the contact connections 16, on the active front face 2*a* to the conductive tracks of the metal layer 24 on the side surfaces of the chip 3, and hence for the contact surfaces 26 on the passive rear face 2*b*.

We claim:

1. An electronic component, comprising:
   a semiconductor chip having an active front face, a passive rear face, and at least one side face with a surface;
   at least one insulating layer disposed on said active front face, said at least one insulating layer including regions of a silicon dioxide layer and regions of a polyimide layer, said regions of a silicon dioxide layer being in direct contact with said active front face and said regions of a polyimide layer being in direct contact with said regions of a silicon dioxide layer;
   an array of structured conductive tracks disposed in direct contact with said regions of a polyimide layer of said at least one insulating layer for providing an electrical connection between said active front face and said passive rear face, said conductive tracks being applied on said surface of said at least one side face;
   contact elements including contact surfaces connected to said conductive tracks and contact studs disposed on said conductive tracks on said active front face, said contact surfaces being disposed on said passive rear face;
   said active front face including an edge angle of around 63° to said at least one side face;
   said regions of a silicon dioxide layer acting as an etch stop;
   said regions of a polyimide layer for protecting said active front face of the semiconductor chip; and
   said regions of a silicon dioxide layer and said regions of a polyimide layer including holes therethrough, extending to said active front face, said holes being filled by a contact providing, electrical connection to external contacts in the form of contact studs.

2. The electronic component according to claim 1, wherein:
   said semiconductor chip has side faces and has edge regions at respective transitions between said side faces and one of said passive rear face and said active front face; and
   said conductive tracks extend along said edge regions.

3. The electronic component according to claim 1, wherein said conductive tracks are composed of at least one material selected from the group consisting of aluminum, copper, silver and gold.

4. The electronic component according to claim 1, wherein said semiconductor chip has etched side faces.

5. The electronic component according to claim 1, wherein:
   said passive rear face and said side face define an edge angle of substantially 117° at a transition between said passive rear face and said side face.

6. The electronic component according to claim 1, wherein said semiconductor chip is a singled semiconductor wafer chip.

7. The electronic component according to claim 1, wherein said semiconductor chip is a chip singled from a semiconductor wafer by anisotropic etching.

8. The electronic component according to claim 1, wherein said structured conductive tracks electrically connect selected ones of said contact studs disposed on said active front face to selected ones of said contact surfaces disposed on said passive rear face.

9. An electronic assembly, comprising:
   stacked electronic components including respective semiconductor chips each having an active front face, a passive rear face, a side face, contact elements including contact studs and contact surfaces, said contact studs being disposed on said active front face and said contact surfaces being disposed on said passive rear face, and each of said semiconductor chips having a respective conductive connection plane extending, via said side face, from said active front face to said passive rear face, each said active front face of a respective semiconductor chip including an insulating layer, said insulating layer including a silicon dioxide layer in direct contact with said active front face and a polyimide layer in direct contact with said silicon dioxide layer, said silicon dioxide layer and said polyimide layer including holes therethrough, extending to said active front face, said holes being filled by a contact providing electrical connection to external contacts in the form of contact studs; and
   each of said electronic components being connected to another one of said electronic components via said contact studs disposed between a conductive track on said active front face of one of said semiconductor chips and a conductive surface disposed on said passive rear face of an adjacent one of said semiconductor chips; and
   said passive rear face of one of said semiconductor chips being followed by said active front face of another of said semiconductor chips.

10. The electronic assembly according to claim 9, wherein said contact connections include solder connections for connecting said contact elements of one of said semiconductor chips to said contact elements of another one of said semiconductor chips.

11. The electronic assembly according to claim 9, wherein said contact connections include at least one of solder connections and adhesive connections for connecting said contact elements of one of said semiconductor chips to said contact elements of another one of said semiconductor chips.

12. The electronic assembly of claim 9, wherein:
   said active front face includes regions of a silicon dioxide layer as an etch stop positioned underneath said structured conductive tracks; and
   regions of a polyimide layer for protecting the front face of the semiconductor chip are located on said silicon dioxide layer.

* * * * *